United States Patent
Im et al.

(10) Patent No.: US 12,272,615 B2
(45) Date of Patent: Apr. 8, 2025

(54) THERMAL MISMATCH REDUCTION IN SEMICONDUCTOR DEVICE MODULES

(71) Applicant: SEMICONDUCTOR COMPONENTS INDUSTRIES, LLC, Phoenix, AZ (US)

(72) Inventors: Seungwon Im, Seoul (KR); Oseob Jeon, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 432 days.

(21) Appl. No.: 17/659,363

(22) Filed: Apr. 15, 2022

(65) Prior Publication Data

US 2023/0335459 A1    Oct. 19, 2023

(51) Int. Cl.
*H01L 23/373* (2006.01)
*H01L 23/00* (2006.01)
*H01L 23/498* (2006.01)
H01L 25/065 (2023.01)

(52) U.S. Cl.
CPC .... *H01L 23/3735* (2013.01); *H01L 23/49838* (2013.01); *H01L 23/49866* (2013.01); *H01L 24/32* (2013.01); H01L 25/0655 (2013.01); H01L 2224/32225 (2013.01); H01L 2924/35121 (2013.01)

(58) Field of Classification Search
CPC ............................. H01L 23/3735; H01L 24/32
See application file for complete search history.

(56) References Cited

U.S. PATENT DOCUMENTS

| | | |
|---|---|---|
| 2002/0140134 A1 | 10/2002 | Topitsch |
| 2013/0328200 A1 | 12/2013 | Bae |
| 2014/0338162 A1 * | 11/2014 | Schulz-Harder ....... H05K 3/103 29/17.3 |

(Continued)

FOREIGN PATENT DOCUMENTS

| | | | | |
|---|---|---|---|---|
| DE | 102013102637 A1 * | 9/2014 | ......... | H01L 23/3735 |
| JP | 2019160969 A | 9/2019 | | |

OTHER PUBLICATIONS

Invar CTE from Ames Web.*
Aluminum alloys CTE engineering toolbox.*
Steel alloys CTE engineering toolbox.*

*Primary Examiner* — Walter H Swanson
*Assistant Examiner* — Jacob T Nelson
(74) *Attorney, Agent, or Firm* — Brake Hughes Bellermann LLP (57) ABSTRACT

In a general aspect, a semiconductor device assembly includes a direct-bonded-metal (DBM) substrate having a ceramic layer, and a first metal layer having a uniform thickness that is disposed on a first surface of the DBM substrate. The assembly further includes a second metal layer disposed on a second surface of the DBM substrate opposite the first surface. The second metal layer includes a first portion having a first thickness, and a second portion having a second thickness, the second thickness being greater than the first thickness. The second portion of the second metal layer includes a metal alloy having a coefficient of thermal expansion (CTE) in a range of 7 to 11 parts-per-million per degrees Celsius (ppm/° C.). The assembly also includes a semiconductor die having a first surface coupled with the second portion of the second metal layer.

19 Claims, 4 Drawing Sheets

(56) References Cited

U.S. PATENT DOCUMENTS

| | | |
|---|---|---|
| 2015/0115452 A1* | 4/2015 | Yoon ...................... H01L 24/29 |
| | | 228/256 |
| 2018/0138152 A1 | 5/2018 | Jong et al. |
| 2020/0315003 A1 | 10/2020 | Lee et al. |
| 2021/0013176 A1 | 1/2021 | Lin et al. |

* cited by examiner

THERMAL MISMATCH REDUCTION IN SEMICONDUCTOR DEVICE MODULES

TECHNICAL FIELD

This description relates to semiconductor device module assemblies. More specifically, this description relates semiconductor device module assemblies (e.g., semiconductor device modules) with reduced stresses associated with thermal mismatch and improved stack height control.

BACKGROUND

Semiconductor device assemblies, such as assemblies including power semiconductor devices (which can be referred to as power modules, multi-chip power modules, etc.), can be implemented using semiconductor die, substrates (e.g., direct-bonded metal substrates) and conductive spacers (e.g., electrically and/or thermally conductive spacers). For instance, such spacers can provide electrical connections between components of a given assembly, and/or facilitate heat dissipation for the assembly (e.g., resulting from operation of the semiconductor die), such as to facilitate dual-sided cooling of the assembly. Current implementations of such assemblies, however, have certain drawbacks. For instance, due to mismatch between respective thermal coefficients of expansion of substrate (e.g., ceramic) materials; semiconductor die and conductive spacers, various stresses can be exerted on the semiconductor die (e.g., tensile stress, peeling stress, shear stress, etc., exerted on the semiconductor die), which can result in damage to the semiconductor die, such as cracking. Also in current implementations, process control for an overall stack height of a power module (e.g., module thickness is difficult to control due to process variation in bond line thickness of a solder layer used to couple a spacer with a substrate. Such process variation can contribute to die cracking due to compression stresses caused during molding encapsulation of the module (e.g., for stack heights above a process target height), or can result in excessive mold flashing (e.g., on a surface of a substrate for stack heights below the process target height). Additional drawbacks of current approaches also include assembly process complexity and quality issues related to process variations.

SUMMARY

In some aspects, the techniques described herein relate to a semiconductor device assembly including: a direct-bonded-metal (DBM) substrate including: a ceramic layer; a first metal layer disposed on a first surface of the DBM substrate, the first metal layer having a uniform thickness; and a second metal layer disposed on a second surface of the DBM substrate opposite the first surface, the second metal layer including: a first portion having a first thickness; and a second portion having a second thickness, the second thickness being greater than the first thickness, the second portion of the second metal layer including a metal alloy having a coefficient of thermal expansion (CTE) in a range of 7 to 11 part-per-million per degrees Celsius (ppm/° C.); and a semiconductor die having a first surface coupled with the second portion of the second metal layer.

In some aspects, the techniques described herein relate to a semiconductor device assembly, wherein the CTE of the metal alloy is in a range of 8 to 10 ppm/° C.

In some aspects, the techniques described herein relate to a semiconductor device assembly, wherein the metal alloy includes a copper molybdenum (CuMo) metal alloy.

In some aspects, the techniques described herein relate to a semiconductor device assembly, wherein the first portion of the second metal layer includes the metal alloy.

In some aspects, the techniques described herein relate to a semiconductor device assembly, wherein: the metal alloy is a first metal; and the second portion of the second metal layer includes a layer of a second metal disposed on the ceramic layer, the second metal having a CTE greater than the CTE of the metal alloy, and the first metal being disposed on the second metal.

In some aspects, the techniques described herein relate to a semiconductor device assembly, wherein the first metal is grown on the second metal.

In some aspects, the techniques described herein relate to a semiconductor device assembly, wherein the layer of the second metal includes a copper layer.

In some aspects, the techniques described herein relate to a semiconductor device assembly, where the first portion of the second metal layer is included in the copper layer.

In some aspects, the techniques described herein relate to a semiconductor device assembly, wherein the first metal layer and the second metal layer are coupled with the ceramic layer using one of: active metal brazing; diffusion bonding; or sintering.

In some aspects, the techniques described herein relate to a semiconductor device assembly, wherein the DBM substrate is a first DBM substrate, the ceramic layer is a first ceramic layer, and the semiconductor die is first semiconductor die, the semiconductor device assembly further including: a second DBM substrate including: a second ceramic layer; a third metal layer disposed on a first surface of the second DBM substrate, the third metal layer having a uniform thickness; and a fourth metal layer disposed on a second surface of the second DBM substrate opposite the first surface, the fourth metal layer including: a first portion having the first thickness; and a second portion having the second thickness, the second portion of the fourth metal layer including the metal alloy; and a second semiconductor die having a first surface coupled with the second portion of the fourth metal layer.

In some aspects, the techniques described herein relate to a semiconductor device assembly, wherein: a second surface of the first semiconductor die opposite the first surface of the first semiconductor die is coupled with the first portion of the fourth metal layer; and a second surface of the second semiconductor die opposite the first surface of the second semiconductor die is coupled with the first portion of the second metal layer.

In some aspects, the techniques described herein relate to a semiconductor device assembly, wherein: the first semiconductor die includes a high-side switch of a half-bridge circuit; and the second semiconductor die includes a low-side switch of the half-bridge circuit.

In some aspects, the techniques described herein relate to a semiconductor device assembly including: a direct-bonded-metal (DBM) substrate including: a ceramic layer; a first metal layer disposed on a first surface of the DBM substrate, the first metal layer having a uniform thickness; and a second metal layer disposed on a second surface of the DBM substrate opposite the first surface, the second metal layer including: a first portion having a first thickness; and a second portion having a second thickness, the second thickness being greater than the first thickness, the second metal layer including a metal alloy having a coefficient of thermal expansion (CTE) in a range of 7 to 11 part-per-million per degrees Celsius (ppm/° C.); and a semiconductor die having a first surface coupled with the second portion of the second metal layer.

In some aspects, the techniques described herein relate to a semiconductor device assembly, wherein the first metal layer includes the metal alloy.

In some aspects, the techniques described herein relate to a semiconductor device assembly, wherein the metal alloy includes a copper molybdenum (CuMo) metal alloy.

In some aspects, the techniques described herein relate to a semiconductor device assembly, wherein the DBM substrate is a first DBM substrate, the ceramic layer is a first ceramic layer, and the semiconductor die is first semiconductor die, the semiconductor device assembly further including: a second DBM substrate including: a second ceramic layer; a third metal layer disposed on a first surface of the second DBM substrate, the third metal layer having a uniform thickness; and a fourth metal layer disposed on a second surface of the second DBM substrate opposite the first surface, the fourth metal layer including: a first portion having the first thickness; and a second portion having the second thickness, the fourth metal layer including the metal alloy; and a second semiconductor die having a first surface coupled with the second portion of the fourth metal layer.

In some aspects, the techniques described herein relate to a semiconductor device assembly, wherein: a second surface of the first semiconductor die opposite the first surface of the first semiconductor die is coupled with the first portion of the fourth metal layer; and a second surface of the second semiconductor die opposite the first surface of the second semiconductor die is coupled with the first portion of the second metal layer.

In some aspects, the techniques described herein relate to a semiconductor device assembly including: a direct-bonded-metal (DBM) substrate including: a ceramic layer; a first metal layer disposed on a first surface of the DBM substrate, the first metal layer having a uniform thickness; and a second metal layer disposed on a second surface of the DBM substrate opposite the first surface, the second metal layer having a uniform thickness; a third metal layer disposed on a portion of the second metal layer, the third metal layer including a metal alloy having a coefficient of thermal expansion (CTE) in a range of 7 to 11 part-per-million per degrees Celsius (ppm/° C.), the CTE of the third metal layer being less than a CTE of the second metal layer; and a semiconductor die having a first surface coupled with the third metal layer.

In some aspects, the techniques described herein relate to a semiconductor device assembly, wherein: the first metal layer and the second metal layer include copper; and the metal alloy includes a copper molybdenum (CuMo) metal alloy.

In some aspects, the techniques described herein relate to a semiconductor device assembly, wherein the metal alloy is grown on the second metal layer.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

This disclosure relates to implementations of semiconductor device assemblies that can be used to implement power semiconductor device assemblies, such as multichip modules (MCMs) with dual-sided cooling. Such assemblies can be used in, e.g., automotive applications, industrial applications, etc. For instance, the implementations described herein can be used for high-power semiconductor device modules, such as half-bridge circuits, power converters, ignition circuits, power transistor pairs, etc. While not specifically shown, the semiconductor device assemblies described herein can also include a molding compound that is used to encapsulate those assemblies. In some implementations, portions of the assemblies can be exposed through, and/or extend out of such molding compound. For instance, surfaces of substrates (e.g., metal surfaces) of the assemblies can be exposed through the molding compound, e.g., for thermal dissipation purposes, such as described herein.

In the implementations described herein, an electrically and/or thermally conductive spacer, or a plurality of spacers can be integrated (e.g., monolithically integrated) in a substrate of the semiconductor device assembly. For instance, such spacers can be included in a metal layer that is disposed on (bonded to, etc.) a ceramic base of a direct-bonded-metal (DBM) substrate. In some implementations, such a metal layer can include a monolithically integrated spacer, and can be implemented as a patterned metal layer used to provide electrical interconnections to and/or between semiconductor die included in a corresponding semiconductor device assembly. For instance, the metal layer can include a first portion having a first thickness and a second portion having a second thickness. The second portion can implement the spacer, and the second thickness can be greater than the first thickness. In such implementations, at least the second portion of the metal layer can include a metal, or metal alloy with a coefficient of thermal expansion (CTE) that is close in value to a CTE of the ceramic base. Such approaches, as compared with current approaches, reduce stresses associated with CTE mismatch between spacer, the ceramic base and a semiconductor die coupled with (e.g. soldered to) the spacer. This reduction in CTE mismatch can help prevent die cracking from occurring and, as a result, improve the quality and reliability of an associated semiconductor device assembly.

Further, the approaches described herein can improve assembly process control (e.g., of module stack height), while also simplifying an associated assembly process. For instance, the use of substrates, such as DBM substrates, with integrated spacers, such as those described herein, allows for elimination of a soldering operation used to couple a separate spacer with a corresponding substrate during semiconductor device module assembly, which allows for a simplified assembly process (e.g., elimination of solder application and associated reflow operations). Also, such solder operations, which use a thick solder bond line (e.g., 100 to 200 microns), can be difficult to control the resulting bond line thickness of the resulting re-flown solder. Accordingly, such solder operations for attaching a spacer can result in, or contribute to relatively large variation in overall stack height (thickness) of a semiconductor device assembly being produced. For instance, the bond line thickness can vary between 50 to 200 microns, and be difficult to control. Accordingly, additional processing operations, such as a grinding operation, may be needed to expose a substrate (e.g., for thermal dissipation) and/or to achieve a desired overall stack height. Using the approaches described herein can significantly reduce such variation as result of elimination of those soldering operations. For instances, using the approaches described herein, stack height tolerance variations of less than plus or minus 10 microns can be achieved. Accordingly, the undesired effects of stack height variation discussed above can also be reduced.

Figure 1A:
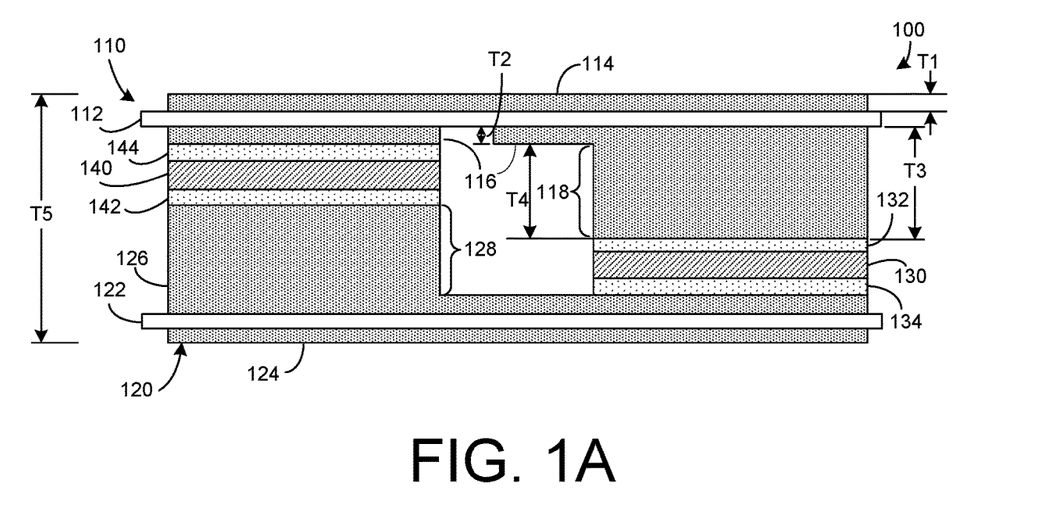
FIG. 1A is a diagram schematically illustrating a side view of a semiconductor device assembly.

FIG. 1A is a diagram schematically illustrating a side view of a semiconductor device assembly 100. As shown in FIG. 1A, the semiconductor device assembly 100 includes a substrate 110, a substrate 120, a semiconductor die 130 and a semiconductor die 140. In this example, the substrate 110 and the substrate 120 are direct-bonded-metal (DBM) substrates that include monolithically integrated spacers. For instance, the substrate 110 includes a ceramic base layer 112, a metal layer 114, as well as a metal layer 116 including a spacer 118. In some implementations, the ceramic base layer 112 can be a ceramic material (such as aluminum oxide ($Al_2O_3$), $Al_2O_3$ doped with zirconium oxide ($Zr_2O_3$), etc.) with a CTE of approximately 7 parts-per-million per degrees Celsius (ppm/° C.).

In the semiconductor device assembly 100, the metal layer 114 is disposed on (coupled with, etc.) a first side of the ceramic base layer 112 and, in this example, has a uniform thickness T1. A value of thickness T1 can depend on the particular embodiment, and the metal layer 114 can facilitate thermal dissipation for heat that is generated by the semiconductor device assembly 100 during its operation. For instance, in some implementations, a heat sink, a water jacket, or other heat dissipation appliance can be coupled with the metal layer 114 to provide such thermal dissipation.

As shown in FIG. 1A, the metal layer 116 of the substrate 110 can be a patterned metal layer with separate sections (e.g., electrically isolated sections) that are used to implement electrical connections to and/or between the semiconductor die 130 and the semiconductor die 140. In this example, the semiconductor device assembly 100 can implement a half-bridge circuit, where the semiconductor die 130 includes a high-side switch of the half-bridge circuit, and the semiconductor die 140 includes a low-side switch of the half-bridge circuit. In other implementations, the semiconductor device assembly 100 can implement other circuits, such as power transistor pairs, ignition circuits, etc.

In this example, a first portion (or portions) of the metal layer 116 can have a thickness T2, which can be a same thickness, or a different thickness than T1. As with the thickness T1, the value of thickness T2 will depend on the particular embodiment, such as on a current rating, or power dissipation rating of the semiconductor device assembly 100. A second portion of the metal layer 116 can have a thickness T3, which is greater than the thickness T2. That is, as shown in FIG. 1A, the thickness T3 is the sum of the thickness T2 and a thickness T4, where the thickness T4 is a thickness (or height) of the spacer 118 that is monolithically integrated (unitary) with the metal layer 116. In this example, the spacer 118 is formed as part of the metal layer 116.

In the semiconductor device assembly 100, the metal layer 114 and the metal layer 116 can be formed from a metal alloy having a CTE that is close in value to the CTE of the ceramic base layer 112, e.g., on the order of 7 ppm/° C. For example, the metal layer 114 and the metal layer 116 can be formed of a metal alloy having a CTE in a range of 7 to 11 ppm/° C., or 8 to 10 ppm/° C., which reduces the CTE differences (mismatch) between the spacer 118, the ceramic base layer 112 and the semiconductor die 130 (CTE on the order of 3 ppm/° C.), as compared with current spacer implementations (CTE on the order of 17 ppm/° C.). This reduction in CTE mismatch can reduces stresses with the semiconductor device assembly 100 and prevent damage, such as cracking, to the semiconductor die 130. For instance, in some implementations, the metal layer 114 and the metal layer 116 can include a copper molybdenum (CuMo) metal alloy with a CTE that is within the ranges noted above. In some implementations the metal layer 114, and at least a portion of the metal layer 116 (e.g., the portion(s) with the thickness T2), can be formed of a different metal of metal alloy than the spacer 118. Such an example is shown in, at least, FIGS. 2A and 2B.

Similar to the substrate 110, the substrate 120 of the semiconductor device assembly 100 includes a ceramic base layer 122, a metal layer 124 and a metal layer 126. In some implementations, the ceramic base layer 122 can be a ceramic material (such as $Al_2O_3$, $Al_2O_3$ doped with $Zr_2O_3$, etc.) with a CTE of approximately 7 parts-per-million per degrees Celsius (ppm/° C.). In some implementations, the ceramic base layer 122 can include a same ceramic material as the ceramic base layer 112.

In the semiconductor device assembly 100, the metal layer 124 is disposed on (coupled with, etc.) a first side of the ceramic base layer 122 and, in this example, can have a thickness that is the same or different that the thickness T1 of the metal layer 114. Again, the value of thickness of the metal layer 124 can depend on the particular embodiment, and the metal layer 124 can facilitate thermal dissipation for heat that is generated by the semiconductor device assembly 100 during its operation. For instance, in some implementations, as with the metal layer 114, a heat sink, a water jacket, or other heat dissipation appliance can be coupled with the metal layer 124 to provide such thermal dissipation, e.g., to implement dual-sided cooling of the semiconductor device assembly 100.

As shown in FIG. 1A, the metal layer 126 of the substrate 120 can be a patterned metal layer that is used to implement electrical connections to and/or between the semiconductor die 130 and the semiconductor die 140. The metal layer 126 can have a first portion (e.g., with approximately a same thickness as the thickness T2), while a second portion of the metal layer 126 can include a monolithically integrated spacer 128. That is, the spacer 128 can be unitary with the metal layer 126 of the substrate 120. That is, in this example, the spacer 128 is formed as part of the metal layer 126.

In the semiconductor device assembly 100, as with the metal layer 114 and the metal layer 116, the metal layer 124 and the metal layer 126 can be formed from a metal alloy having a CTE that is close in value to the CTE of the ceramic base layer 122. For example, a metal alloy having a CTE in a range of 7 to 11 ppm/° C., or a range of 8 to 10 ppm/° C. can be used. In some implementations, the metal layer 124 and the metal layer 126 can include a copper molybdenum (CuMo) metal alloy with a CTE within the ranges noted above (and achieve similar reductions in CTE mismatch between the elements of the semiconductor device assembly 100. In some implementations the metal layer 124, and at least a portion of the metal layer 126, can be formed of a different metal than the spacer 128. For instance, copper, copper alloys, aluminum, aluminum alloys, etc. can be used in combination with a metal alloy having a CTE that is close in value to a CTE of the ceramic base layer 122, such as CuMo. As noted above, such an example is shown in, at least FIGS. 2A and 2B.

In the semiconductor device assembly 100, because the spacer 118 and the spacer 128 are monolithically integrated with, respectively, the metal layer 116 and the metal layer 126, an associated assembly process for producing the semiconductor device assembly 100 can be simplified as compared to current approaches, where a separate spacer is soldered (e.g., using a lead-based solder for a lower reflow point) to a metal layer of a DBM substrate. That is, a solder application operation (solder print or dispense), as well as a solder reflow operation corresponding with such spacer attachment can be eliminated. Further, elimination of such solder operations also allows for better control of an overall stack height T5 of the semiconductor device assembly 100, as described herein.

As further illustrated in FIG. 1A, the semiconductor die 130 can be coupled with the spacer 118 of the substrate 110 via a solder layer 132, and also coupled with the metal layer 126 of the substrate 120 via a solder layer 134. Similarly, the semiconductor die 140 can be coupled with the spacer 128 of the substrate 120 via a solder layer 142 and also coupled with the metal layer 116 of the substrate 110 via a solder layer 144. In this example, the solder layers 132, 134, 142 and 144 can have relatively thin bond line thicknesses (e.g., in a range of 30 to 50 microns). Also, these solder layers can be implemented using lead free solder with higher reflow temperatures and compliant with environmental regulations.

Figure 1B:
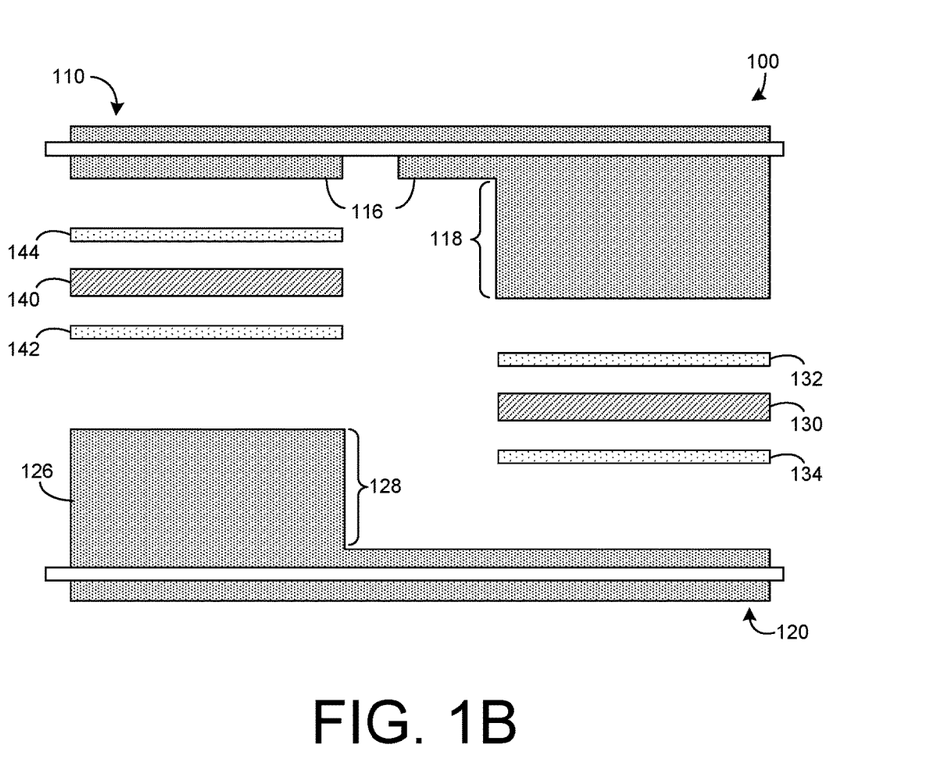
FIG. 1B is a diagram illustrating an expanded view of the semiconductor device assembly of FIG. 1A.

FIG. 1B is a diagram illustrating an expanded view of the semiconductor device assembly 100 of FIG. 1A. The expanded view of FIG. 1B illustrates the elements of the semiconductor device assembly 100 prior to its assembly. That is, FIG. 1B illustrates the substrate 110, the substrate 120, the semiconductor die 130, and the semiconductor die 140. FIG. 1A also illustrates the solder layer 132, which is used to couple the semiconductor die 130 with the spacer 118 of the substrate 110, and the solder layer 134, which is used to couple the semiconductor die 130 with the metal layer 126 of the substrate 120. Further, FIG. 1A illustrates the solder layer 142, which is used to couple the semiconductor die 140 with the spacer 128 of the substrate 120, and the solder layer 144, which is used to couple the semiconductor die 140 with the metal layer 116 of the substrate 110.

Figure 2A:
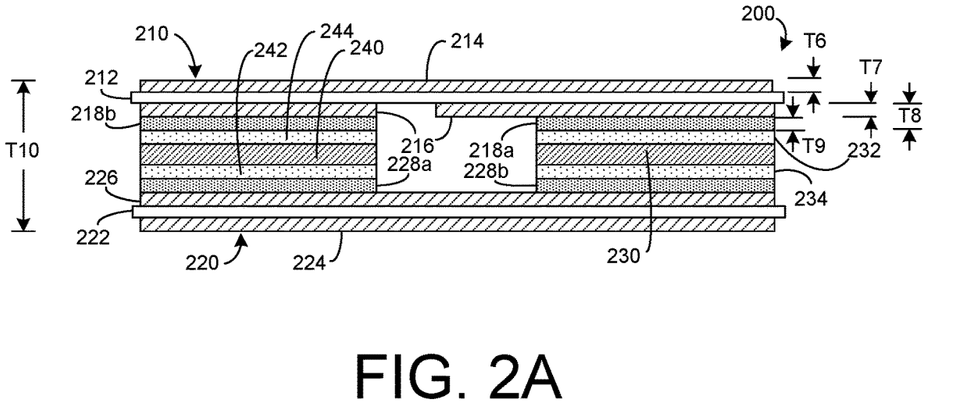
FIG. 2A is a diagram schematically illustrating a side view of another semiconductor device assembly.

FIG. 2A is a diagram schematically illustrating a side view of another semiconductor device assembly 200. As shown in FIG. 2A, the semiconductor device assembly 200 includes a substrate 210, a substrate 220, a semiconductor die 230 and a semiconductor die 240. In this example, the substrate 210 and the substrate 220, as with the substrate 110 and the substrate 120, are direct-bonded-metal (DBM) substrates that include monolithically integrated spacers. For instance, the substrate 210 includes a ceramic base layer 212, a metal layer 214, a metal layer 216, a first monolithically integrated spacer 218a and a second monolithically integrate spacer 218b. In some implementations, the ceramic base layer 212 can be a ceramic material (such as those described herein) with a CTE of approximately 7 parts-per-million per degrees Celsius (ppm/° C.).

In the semiconductor device assembly 200, the metal layer 214 is disposed on (coupled with, etc.) a first side of the ceramic base layer 212 and, in this example, has a uniform thickness T6. In this example, the metal layer 214 can be a copper metal layer (e.g., formed from a copper sheet). The value of thickness T5 can depend on the particular embodiment, and the metal layer 214 can facilitate thermal dissipation for heat that is generated by the semiconductor device assembly 200 during its operation. For instance, in some implementations, a heat sink, a water jacket, or other heat dissipation appliance can be coupled with the metal layer 214 to provide such thermal dissipation.

As shown in FIG. 2A, the metal layer 216 of the substrate 210 can be a patterned metal layer with separate sections (e.g., electrically isolated sections) that are used to implement electrical connections to and/or between the semiconductor die 230 and the semiconductor die 240. In this example, as with the semiconductor device assembly 100, the semiconductor device assembly 200 can implement a half-bridge circuit, where the semiconductor die 230 includes a high-side switch of the half-bridge, and the semiconductor die 240 includes a low-side switch of the half-bridge. In other implementations, the semiconductor device assembly 200 can implement other circuits, such as power transistor pairs, ignition circuits, etc.

As shown in FIG. 2A, a first portion (or portions) of the metal layer 216 can have a thickness T7, which can be a same thickness or a different thickness than T6. As with the thickness T6, the value of thickness T7 will depend on the particular embodiment, such as on a current rating, or power dissipation rating of the semiconductor device assembly 200. In the semiconductor device assembly 200, the spacers 218a and 218b can be monolithically integrated with (e.g., grown on, directly bonded to, etc.) the metal layer 216. As shown in FIG. 2A, a thickness T8 is the sum of the thickness T7 of the metal layer 216 and a thickness T9, where the thickness T9 is a thickness (or height) of the spacer 218a (and a spacer 218b) that is monolithically integrated with the metal layer 216. That is, in this example, the substrate 210, including the spacer 218a and the spacer 218b, is a unitary body.

In the semiconductor device assembly 200, the metal layer 214 and the metal layer 216 can be formed from copper, while the spacers 218a and the spacer 218b can be formed from a metal alloy having a CTE that is close in value to the CTE of the ceramic base layer 212. For example, the spacer 218a and the spacer 218b can be formed of a metal alloy having a CTE in a range of 7 to 11 ppm/° C., or 8 to 10 ppm/° C. For instance, the spacers 218a and the spacer 218b can include copper molybdenum (CuMo) metal alloy with a CTE within the ranges noted above.

Similar to the substrate 210, the substrate 220 of the semiconductor device assembly 200 includes a ceramic base layer 222, a metal layer 224, a metal layer 226, a spacer 228a, and a spacer 228b. In some implementations, the ceramic base layer 222 can be a ceramic material (such as those described herein) with a CTE of approximately 7 parts-per-million per degrees Celsius (ppm/° C.). In some implementations, the ceramic base layer 222 can include a same ceramic material as the ceramic base layer 212. In comparison to the semiconductor device assembly 100, in the semiconductor device assembly 200, rather than using a single spacer (e.g., the spacer 118 or the spacer 128) for each semiconductor die (e.g., the spacer 118 on the substrate 110 and the spacer 128 on the substrate 120), the semiconductor device assembly 200 includes a divided spacer arrangement. That is, in the semiconductor device assembly 200, the spacer 218a of the substrate 210 is coupled with a first side of the semiconductor die 230, while a spacer 228b of the substrate 220 is coupled with a second side of the semiconductor die 230. Similarly in the semiconductor device assembly 200, a spacer 228a of the substrate 220 is coupled with a first side of the semiconductor die 240, while a spacer 218b of the substrate 210 is coupled with a second side of the semiconductor die 240, opposite the first side.

In the semiconductor device assembly 200, the metal layer 224 is disposed on (coupled with, etc.) a first side of the ceramic base layer 222 and, in this example, can have a thickness that is the same or different that the thickness T6 of the metal layer 214. Again, the value of thickness of the metal layer 224 can depend on the particular embodiment, and the metal layer 224 can facilitate thermal dissipation for heat that is generated by the semiconductor device assembly 200 during its operation. For instance, in some implementations, as with the metal layer 214, a heat sink, a water jacket, or other heat dissipation appliance can be coupled with the metal layer 224 to provide such thermal dissipation.

The metal layer 226 of the substrate 220, which is disposed on a second side of the substrate 220, can be a patterned metal layer is used to implement electrical connections to and/or between the semiconductor die 230 and the semiconductor die 240. The metal layer 226 can have a thickness that is approximately a same thickness as the thickness T7. In the semiconductor device assembly 200, the spacer 228a and the spacer 228b can be monolithically integrated with (e.g., grown on, directly bonded to, etc.) the metal layer 226, and can have approximately a same thickness as the spacer 218a and the spacer 218b. In this example, the spacer 228a and the spacer 228b are integrated with (coupled with, directly bonded to, grown on, etc.) the metal layer 226, such that the substrate 220, including the spacer 228a and the spacer 228b, is a unitary body.

As discussed above with respect to the semiconductor device assembly 100, because the spacer 218a, the spacer 218b, the spacer 228a, and the spacer 228b are monolithically integrated (unitary) with, respectively, the metal layer 216 and the metal layer 226, an associated assembly process for producing the semiconductor device assembly 200 can be simplified as compared to current approaches, where a separate spacer is soldered (e.g., using a lead-based solder for a lower reflow point) to a metal layer of a DBM substrate. That is, a solder application operation (solder print or dispense), as well as a solder reflow operation corresponding with such spacer attachment can be eliminated. Further, elimination of such solder operations also allows for better control of an overall stack height T10 of the semiconductor device assembly 200, as described herein.

As further illustrated in FIG. 2A, the semiconductor die 230 can be coupled with the spacer 218a of the substrate 210 via a solder layer 232, and also coupled with the spacer 228b of the substrate 220 via a solder layer 234. Similarly, the semiconductor die 240 can be coupled with the spacer 228a of the substrate 220 via a solder layer 242 and also coupled with the spacer 218b of the substrate 210 via a solder layer 244. In this example, the solder layers 232, 234, 242 and 244 can have relatively thin bond line thicknesses (e.g., in a range of 30 to 50 microns). Also, these solder layers can be implemented using lead free solder with higher reflow temperatures.

Figure 2B:
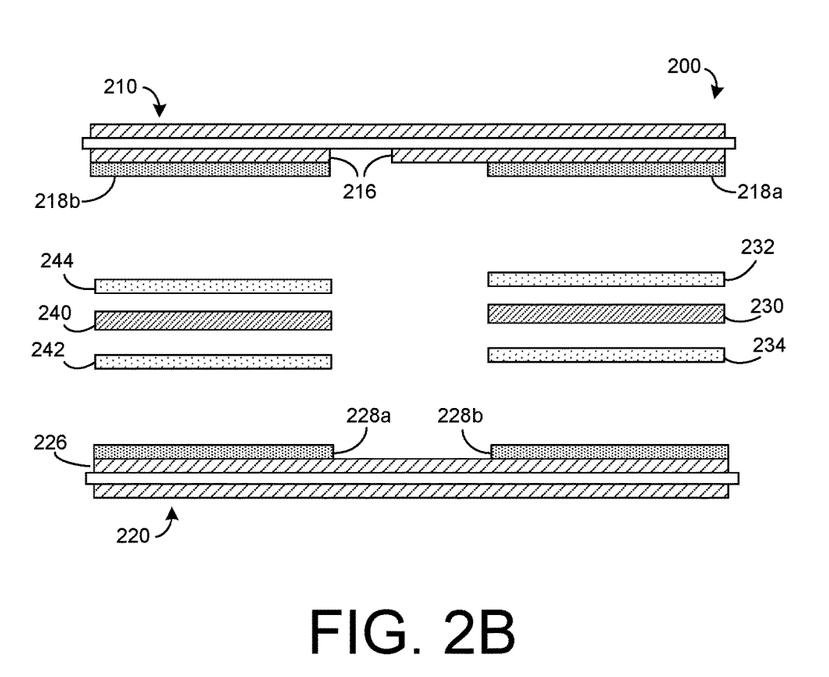
FIG. 2B is a diagram illustrating an expanded view of the semiconductor device assembly of FIG. 1A.

FIG. 2B is a diagram illustrating an expanded view of the semiconductor device assembly 200 of FIG. 1A. The expanded view of FIG. 2B illustrates the elements of the semiconductor device assembly 200 prior to its assembly. That is, FIG. 2B illustrates the substrate 210, the substrate 220, the semiconductor die 230, and the semiconductor die 240. FIG. 2A also illustrates the solder layer 232, which is used to couple the semiconductor die 230 with the spacer 218a of the substrate 210, and the solder layer 234, which is used to couple the semiconductor die 230 with the spacer 228b of the substrate 220. Further, FIG. 2A illustrates the solder layer 242, which is used to couple the semiconductor die 240 with the spacer 228a of the substrate 220, and the solder layer 244, which is used to couple the semiconductor die 240 with the spacer 218b of the substrate 210.

Figure 3A:
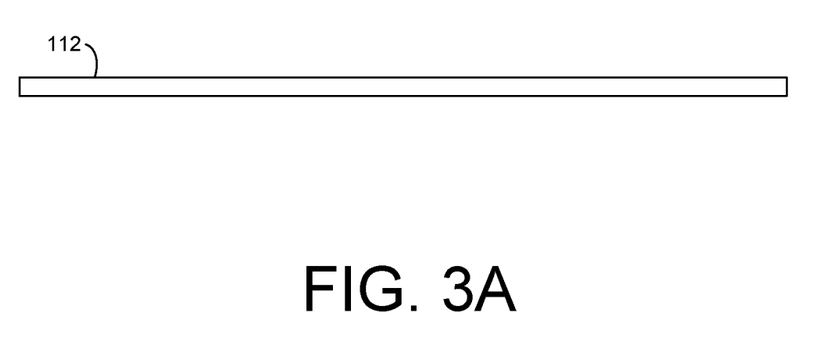
FIGS. 3A and 3B are diagrams schematically illustrating a process for producing the substrate of the semiconductor device assembly illustrated in FIGS. 1A and 1B.
Figure 3B:
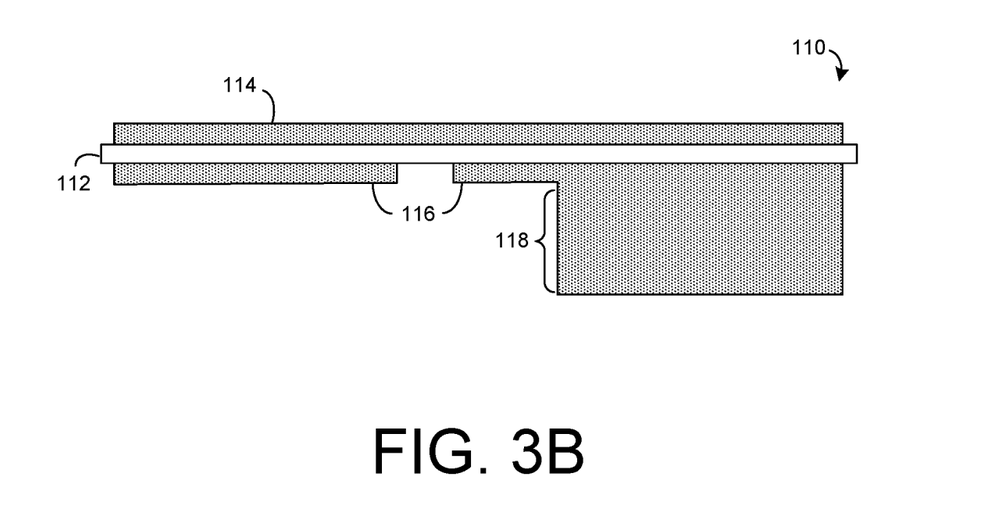

FIGS. 3A and 3B are diagrams schematically illustrating a process for producing the substrate 110 of the semiconductor device assembly 100 illustrated in FIGS. 1A and 1B. In example implementations, the process of FIGS. 3A and 3B can also be used to produce the substrate 120 of the semiconductor device assembly 100. As shown in in FIG. 3A, the illustrated process for producing the substrate 110 begins with the ceramic base layer 112 being provided. Referring to FIG. 3B, the metal layer 114 and the metal layer 116 can then then be formed on (coupled to, bonded to, etc.) the ceramic base layer 112 using a number of different approaches. For instance, depending on the particular implementation, the metal layer 114 and the metal layer 116 can be coupled with the ceramic base layer 112 using active metal brazing, diffusion bonding or sintering.

In some implementations, the metal layer 114 and the metal layer 116 can be formed using respective patterned seed layers. That is, in this example, the metal layer 114 and the metal layer 116 can be grown on the ceramic base layer 112 in correspondence with the seed layer pattern, e.g. using a chemical vapor deposition process, a sputtering process, or other appropriate approach. In some implementations, the metal layer 114 and the metal layer 116 can be patterned before attachment to the ceramic base layer 112. In some implementations, sheets of metal or metal alloy (e.g., CuMo) can be coupled with the ceramic base layer 112 and patterned after attachment.

Figure 4A:
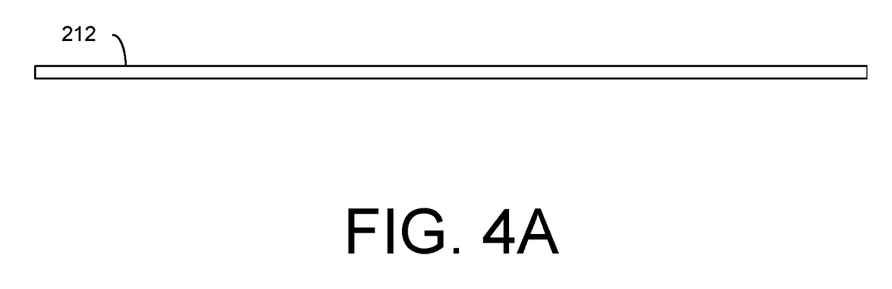
FIGS. 4A to 4C are diagrams schematically illustrating a process for producing the substrate of the semiconductor device assembly illustrated in FIGS. 2A and 2B.
Figure 4B:
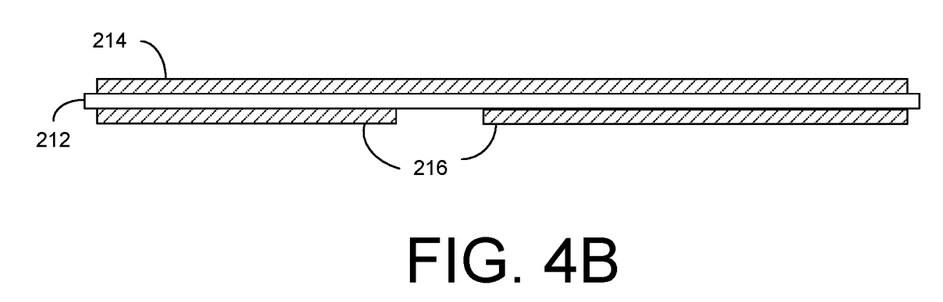
Figure 4C:
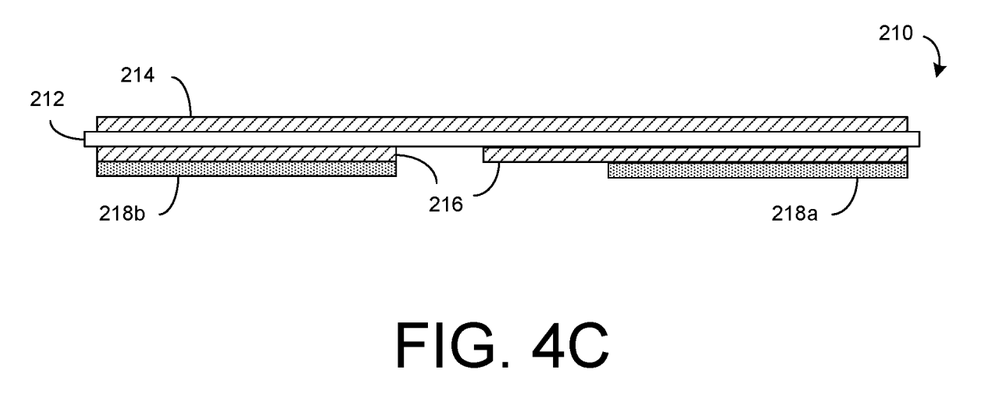

FIGS. 4A to 4C are diagrams schematically illustrating a process for producing the substrate 210 of the semiconductor device assembly 200 illustrated in FIGS. 2A and 2B. In example implementations, the process of FIGS. 4A to 4C can also be used to produce the substrate 220 of the semiconductor device assembly 200. As shown in in FIG. 4A, the illustrated process for producing the substrate 210 begins with the ceramic base layer 212 being provided. Referring to FIG. 4B, the metal layers 214 and 216 can then then be formed on (coupled to, bonded to, etc.) the ceramic base layer 212 using a number of different approaches. For instance, depending on the particular implementation, the metal layer 114 and the metal layer 116 can be coupled with the ceramic base layer 212 using active metal brazing, diffusion bonding or sintering. In this example, the metal layer 214 and the metal layer 216 can be formed from copper sheets that are patterned before or after attachment to the ceramic base layer 212.

Referring to FIG. 4C, the spacer 218a and the spacer 218b can then be formed on the metal layer 216, e.g., using respective patterned seed layers formed on the metal layer 216. For instance, the spacer 218a and the 218b can be grown on the metal layer 216 in correspondence with respective seed layer patterns, e.g. using a chemical vapor deposition process, a sputtering process, or other appropriate approach.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device assembly comprising:
    a first direct-bonded-metal (DBM) substrate including:
        a first ceramic layer, and
        a first metal layer disposed on a first surface of the first ceramic layer, the first metal layer including:
            a first portion having a first thickness; and
            a second portion having a second thickness, the second thickness being greater than the first thickness, the second portion including a metal alloy having a coefficient of thermal expansion (CTE) in a range of 7 to 11 part-per-million per degrees Celsius (ppm/° C.);
    a first semiconductor die having a first surface coupled with the second portion of the first metal layer;
    a second DBM substrate including a second ceramic layer, and a second metal layer disposed on a first surface of the second ceramic layer, the second metal layer including a first portion having the first thickness, and a second portion having the second thickness and including the metal alloy; and
    a second semiconductor die having a first surface coupled with the second portion of the second metal layer, and a second surface coupled with the first portion of the first metal layer,
    a second surface of the first semiconductor die being coupled with the first portion of the second metal layer.

2. The semiconductor device assembly of claim 1, wherein the CTE of the metal alloy is in a range of 8 to 10 ppm/° C.

3. The semiconductor device assembly of claim 1, wherein the metal alloy includes a copper molybdenum (CuMo) metal alloy.

4. The semiconductor device assembly of claim 1, wherein the first portion of the first metal layer includes the metal alloy.

5. The semiconductor device assembly of claim 1, wherein:
    the metal alloy is a first metal;
    the second portion of the first metal layer includes a layer of a second metal disposed on the first ceramic layer;
    the second metal having a CTE greater than the CTE of the metal alloy; and
    the first metal being disposed on the second metal.

6. The semiconductor device assembly of claim 5, wherein the first metal is grown on the second metal.

7. The semiconductor device assembly of claim 5, wherein the layer of the second metal includes a copper layer.

8. The semiconductor device assembly of claim 7, wherein the first portion of the first metal layer is included in the copper layer.

9. The semiconductor device assembly of claim 1, wherein the first metal layer is coupled with the first ceramic layer using one of:
    active metal brazing;
    diffusion bonding; or
    sintering.

10. The semiconductor device assembly of claim 1, further comprising:
    a third metal layer disposed on a first second surface of the first ceramic layer opposite the first surface of the first ceramic layer, the third metal layer having a uniform thickness; and
    a fourth metal layer disposed on a second surface of the second ceramic layer opposite the first surface of the second ceramic layer, the fourth metal layer having a uniform thickness.

11. The semiconductor device assembly of claim 10, wherein:
    the first semiconductor die includes a high-side switch of a half-bridge circuit; and
    the second semiconductor die includes a low-side switch of the half-bridge circuit.

12. A semiconductor device assembly comprising:
    a first direct-bonded-metal (DBM) substrate including:
        a first ceramic layer; and
        a first metal layer disposed on a first surface of the first ceramic layer, the first metal layer including:
            a first portion having a first thickness; and
            a second portion having a second thickness, the second thickness being greater than the first thickness, the first metal layer including a metal alloy having a coefficient of thermal expansion (CTE) in a range of 7 to 11 part-per-million per degrees Celsius (ppm/° C.);

a first semiconductor die having a first surface coupled with the second portion of the first metal layer;

a second DBM substrate including a second ceramic layer, and a second metal layer disposed on a first surface of the second ceramic layer, the second metal layer including a first portion having the first thickness, and a second portion having the second thickness; and a second semiconductor die having a first surface coupled with the second portion of the second metal layer, and a second surface coupled with the first portion of the first metal layer, a second surface of the first semiconductor die being coupled with the first portion of the second metal layer.

13. The semiconductor device assembly of claim 12, further comprising a third metal layer disposed on a second surface of the first ceramic layer opposite the first surface of the first ceramic layer, the third metal layer including the metal alloy.

14. The semiconductor device assembly of claim 13, wherein the metal alloy includes a copper molybdenum (CuMo) metal alloy.

15. The semiconductor device assembly of claim 12, further comprising:

a third metal layer disposed on a second surface of the first ceramic layer opposite the first surface of the first ceramic layer, the third metal layer having a uniform thickness; and a fourth metal layer disposed on a second surface of the second ceramic layer opposite the first surface of the second ceramic layer, the fourth metal layer having a uniform thickness.

16. The semiconductor device assembly of claim 15, where the second metal layer, the third metal layer, and the fourth metal layer include the metal alloy.

17. A semiconductor device assembly comprising:

a direct-bonded-metal (DBM) substrate including:

a ceramic layer;

a first metal layer disposed on a first surface of ceramic layer, the first metal layer having a uniform thickness; and a second metal layer disposed on a second surface of the ceramic layer opposite the first surface, the second metal layer having a uniform thickness;

a third metal layer directly disposed on a portion of the second metal layer, the third metal layer including a metal alloy having a coefficient of thermal expansion (CTE) in a range of 7 to 11 part-per-million per degrees Celsius (ppm/° C.), the CTE of the third metal layer being less than a CTE of the second metal layer; and a semiconductor die having a first surface coupled with the third metal layer.

18. The semiconductor device assembly of claim 17, wherein:

the first metal layer and the second metal layer include copper; and the metal alloy includes a copper molybdenum (CuMo) metal alloy.

19. The semiconductor device assembly of claim 17, wherein the metal alloy is grown on the second metal layer.

* * * * *